(12) United States Patent
Hou

(10) Patent No.: US 8,779,315 B2
(45) Date of Patent: Jul. 15, 2014

(54) COVER GLASS PRESSURE BUTTON

(75) Inventor: Chih-Sheng Hou, Taipei (TW)

(73) Assignee: Universal Cement Corporation, Taipei (TW)

( * ) Notice: Subject to any disclaimer, the term of this patent is extended or adjusted under 35 U.S.C. 154(b) by 552 days.

(21) Appl. No.: 13/151,385

(22) Filed: Jun. 2, 2011

(65) Prior Publication Data

US 2012/0305377 A1    Dec. 6, 2012

(51) Int. Cl.
*H01H 1/14*   (2006.01)

(52) U.S. Cl.
USPC ............................................. 200/534

(58) Field of Classification Search
CPC ............ H01H 13/785; H01H 2201/02; H01H 2231/016; H01H 13/12; H01H 13/52; H01H 13/70; H01H 59/0009; H01H 57/00; H01H 1/20
USPC ............... 200/181, 534, 520, 510, 51.16, 333, 200/341; 310/311, 314, 319
See application file for complete search history.

(56) References Cited

U.S. PATENT DOCUMENTS

| 3,621,328 A * | 11/1971 | Epstein et al. .................. 345/78 |
| 6,861,961 B2 * | 3/2005 | Sandbach et al. ............... 341/22 |
| 2007/0119698 A1 * | 5/2007 | Day ............................. 200/510 |

* cited by examiner

*Primary Examiner* — Edwin A. Leon
(74) *Attorney, Agent, or Firm* — Lowe Hauptman & Ham, LLP

(57) ABSTRACT

A cover glass pressure button (CGPB) is disclosed for an electronic device that has an image display module which is protected by a cover glass. When the cover glass is pressed, the CGPB senses the pressure to output a corresponding physical parameter to a control circuit for triggering a function of the image display module.

32 Claims, 12 Drawing Sheets

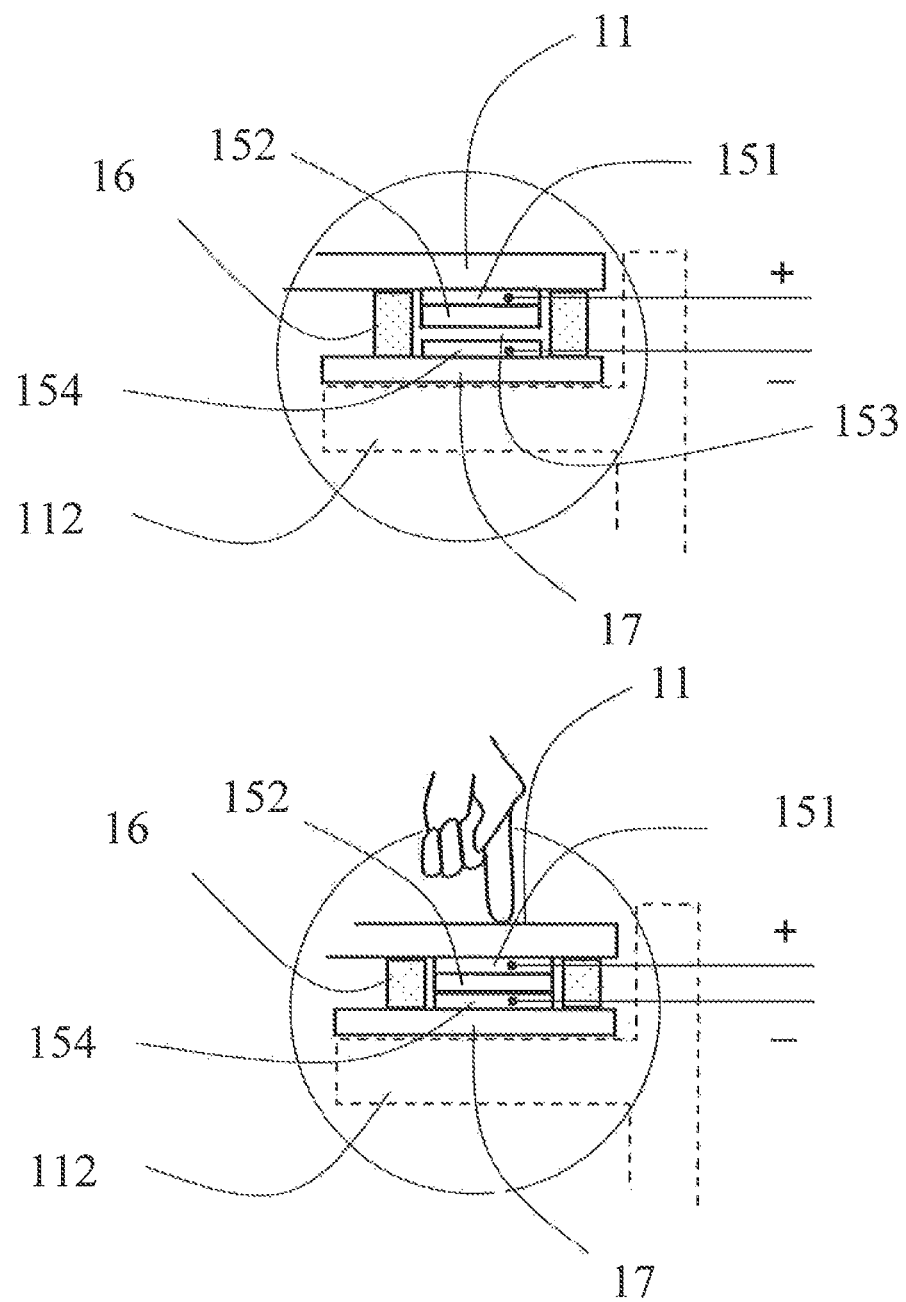

COVER GLASS PRESSURE BUTTON

BACKGROUND

1. Technical Field

The present invention relates to a pressure button, especially to a cover glass pressure button (CGPB) for an electronic device which has an image display and a cover glass.

2. Description of Related Art

FIG. 1A shows a top view of a prior art cell phone.

A piece of cover glass 11 is mounted on top of a cell phone 10. Dash line frame 12 shows an visible display area of an image display module in the cell phone 10.

FIG. 1B shows a section view of FIG. 1A according to line AA'

A flange 112 is designed for holding the cover glass 11 in a cell phone 10. The cover glass 11 has a top surface 11T and a bottom surface 11B. An image display module 115 is configured below the cover glass 11 for displaying images. A space is reserved in between the cover glass 11 and the image display module 115. The cover glass 11 is a protection layer for underlying elements.

BRIEF DESCRIPTION OF THE DRAWINGS

FIG. 3A shows the first embodiment before being pressed
FIG. 3B shows the first embodiment being pressed

DETAILED DESCRIPTION OF THE INVENTION

This invention discloses a cover glass pressure button (CGPB) for an electronic device such as a cell phone, a portable media player, a tablet, or a personal digital assistant (PDA) . . . etc. that has a cover glass on top.

Figures 1A, 1B:
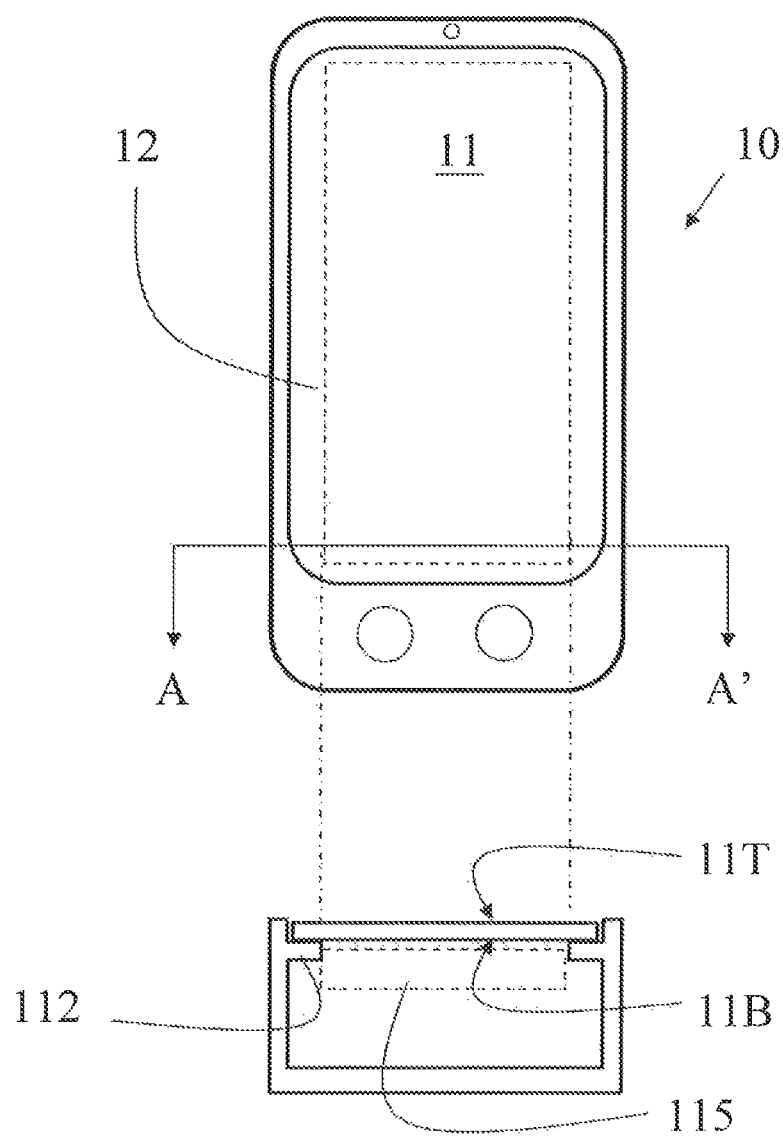
FIG. 1A shows a top view of a prior art cell phone.
FIG. 1B shows a section view of FIG. 1A according to line AA
Figures 2A, 2B:
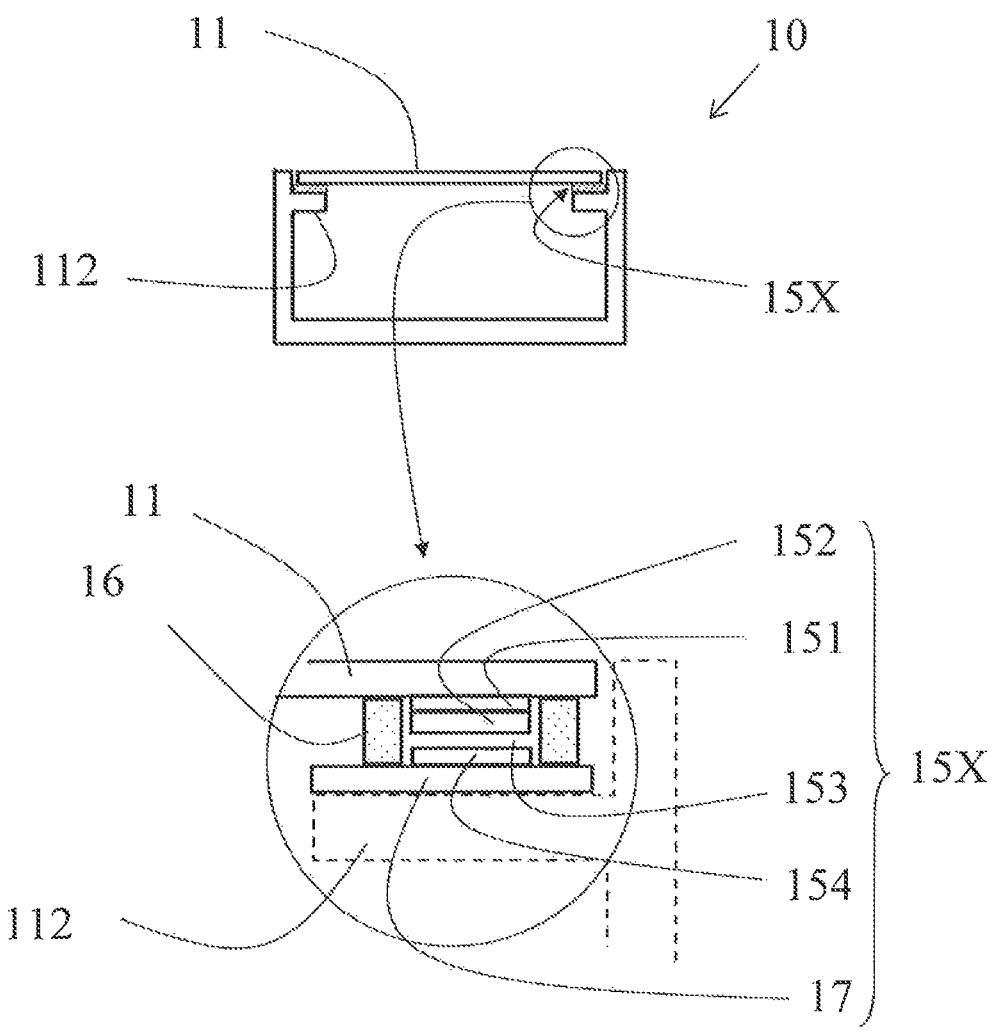
'
FIG. 2A shows a first embodiment of the present invention
FIG. 2B shows an enlarged view of partial area of FIG. 2A

FIG. 2A shows a first embodiment of the present invention

A cover glass 11 is mounted on top of a cell phone 10. A microstructure 15X is configured in between the cover glass 11 and a flange 112. The microstructure 15X incorporating the cover glass 11 forms a CGPB according to the present invention.

FIG. 2B shows an enlarged view of partial area of FIG. 2A

The microstructure 15X is configured on bottom surface of the cover glass 11. A top electrode 151 is configured on bottom surface of the cover glass 11. A piece of piezoresistive material 152 or other pressure sensitive material is configured on the bottom surface of the top electrode 151. A space 153 is reserved under the piezoresistive material 152. A bottom electrode 154 is configured under the space 153 and formed on a bottom substrate 17. The microstructure 15X incorporating the cover glass 11 forms a CGPB. The CGPB is configured on top of the flange 112 of the cell phone 10. When the cover glass 11 is depressed, the CGPB senses the pressure to output a corresponding physical parameter e.g. conductivity (piezoresistive material), charge, or capacitance, to a control circuit (not shown) for triggering a predetermined function. A pair of depressible spacers 16, in the section view, is configured in between the cover glass 11 and the bottom substrate 17 for keeping the space 153 in between the piezoresistive material 152 and the bottom electrode 154.

FIG. 3A shows the first embodiment before being pressed

Before the cover glass 11 is pressed, the space 153 in between the piezoresistive material 152 and the bottom electrode 154 keeps the electrical path open between the top electrode 151 and the bottom electrode 154.

FIG. 3B shows the first embodiment being pressed

After the cover glass 11 is pressed, the space 153 disappears. When the piezoresistive material 152 touches the bottom electrode 154, the electrical path becomes closed between the top electrode 151 and the bottom electrode 154.

Figure 4:
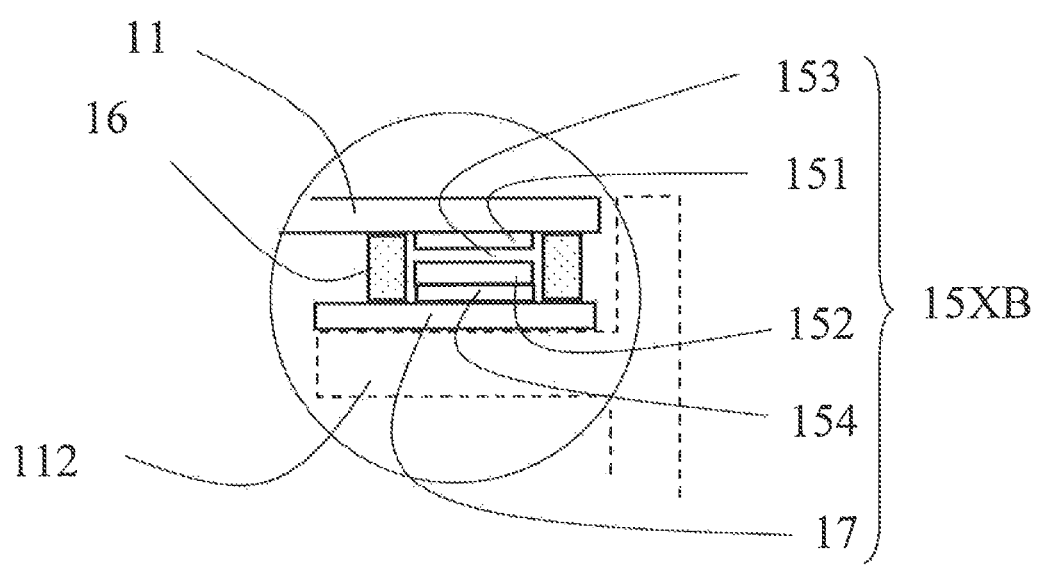
FIG. 4 shows a second embodiment of the present invention

FIG. 4 shows a second embodiment of the present invention

The structure is similar to the structure of FIG. 3A, and only the piezoresistive material 152 and the space 153 are reversed in position. The microstructure 15XB is configured on bottom surface of the cover glass 11. A top electrode 151 is configured on bottom surface of the cover glass 11. A space 153 is reserved under top electrode 151. A piece of piezoresistive material 152 is configured under the space 153. A bottom electrode 154 is configured on bottom surface of the piezoresistive material 152 and formed on a bottom substrate 17. The microstructure 15XB incorporating the cover glass 11 forms a CGPB.

Figures 5A, 5B:
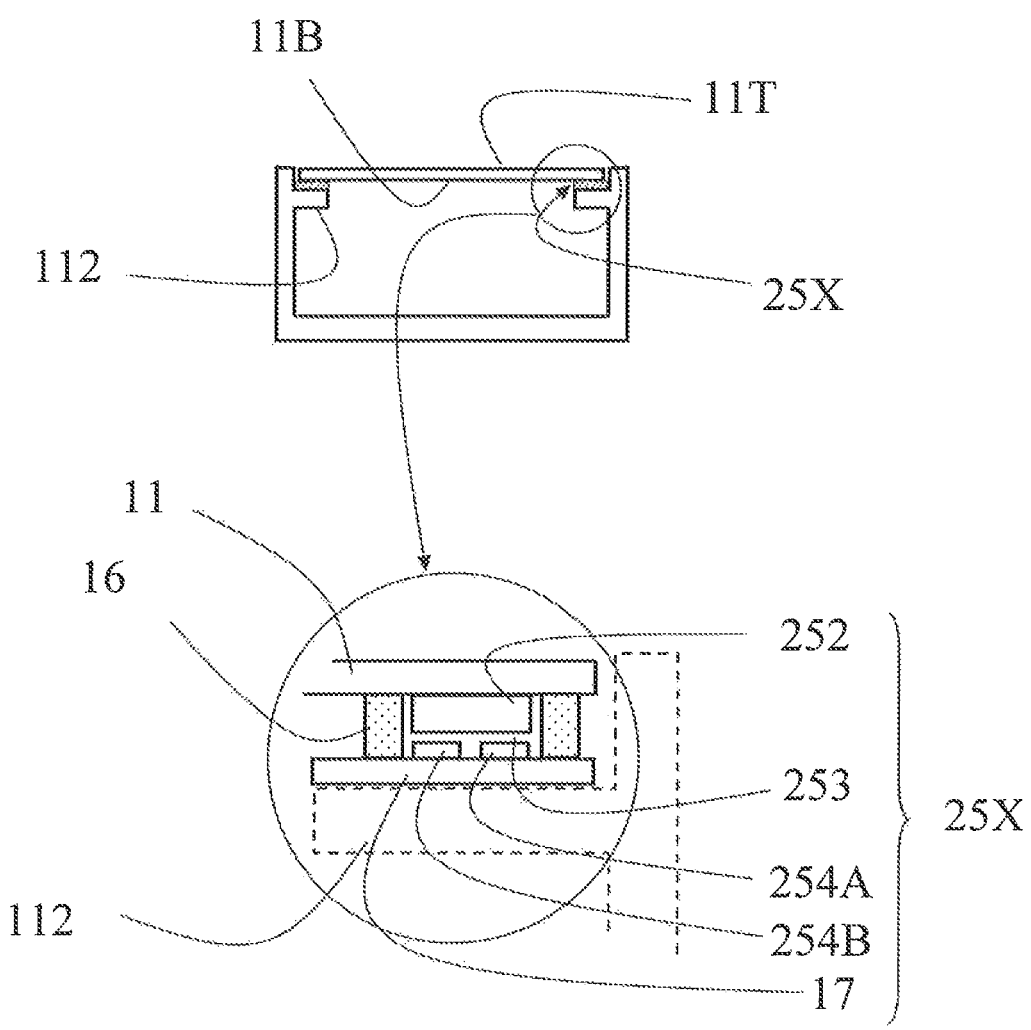
FIG. 5A shows a third embodiment of the present invention
FIG. 5B shows an enlarged view of partial area of FIG. 5A

FIG. 5A shows a third embodiment of the present invention

A cover glass 11 is mounted on top of a cell phone 10. A microstructure 25X is configured in between the cover glass 11 and the flange 112. The microstructure 25X incorporating the cover glass 11 forms a CGPB according to the present invention.

FIG. 5B shows an enlarged view of partial area of FIG. 5A

The microstructure 25X is configured on bottom surface of the cover glass 11. A piece of piezoresistive material 252 is configured on bottom surface of the cover glass 11. A space 253 is reserved under the piezoresistive material 252. A first electrode 254A and a second electrode 254B are configured under the space 253 and formed on a bottom substrate 17. A pair of depressible spacers 16, in the section view, is configured in between the cover glass 11 and the bottom substrate 17 for keeping the space 253 in between the piezoresistive material 252 and the electrodes 254A, 254B.

Figure 6:
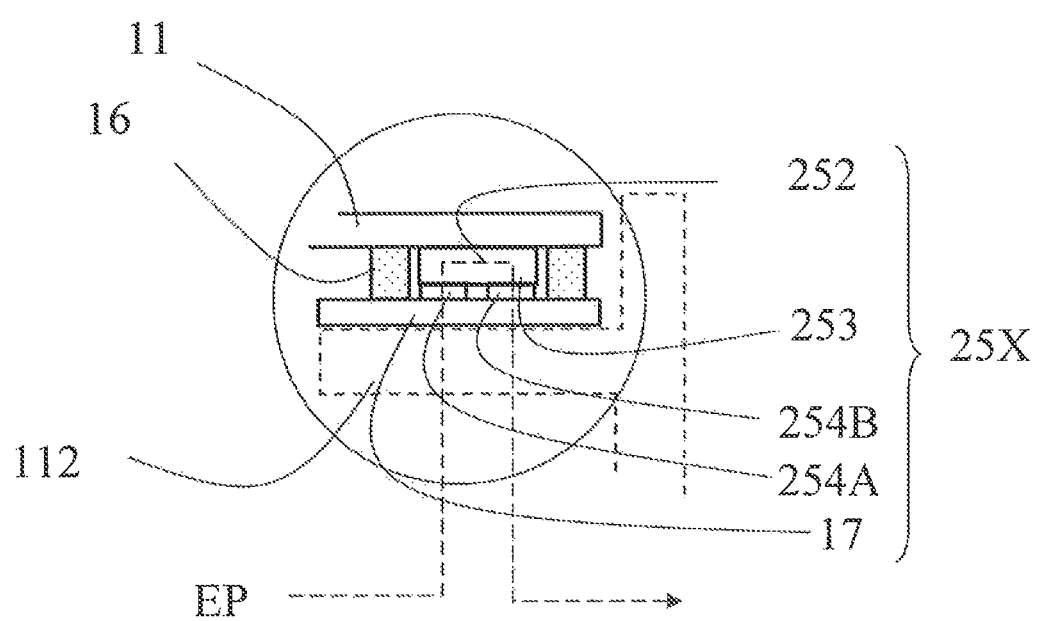
FIG. 6 shows the second embodiment being pressed

FIG. 6 shows the second embodiment being pressed

Before the cover glass 11 is pressed, the space 253 in between the piezoresistive material 252 and the electrodes 254A, 254B keeps the electrical path open between the first electrode 254A and the second electrode 254B. After the cover glass 11 is pressed, the space 253 disappears. When the piezoresistive material 252 touches the first and second electrodes 254A, 254B, the electrical path becomes closed between the first electrode 254A and the second electrode 254B through the piezoresistive material 252. The closed electrical path is shown as the dashed line EP.

Figures 7A, 7B:
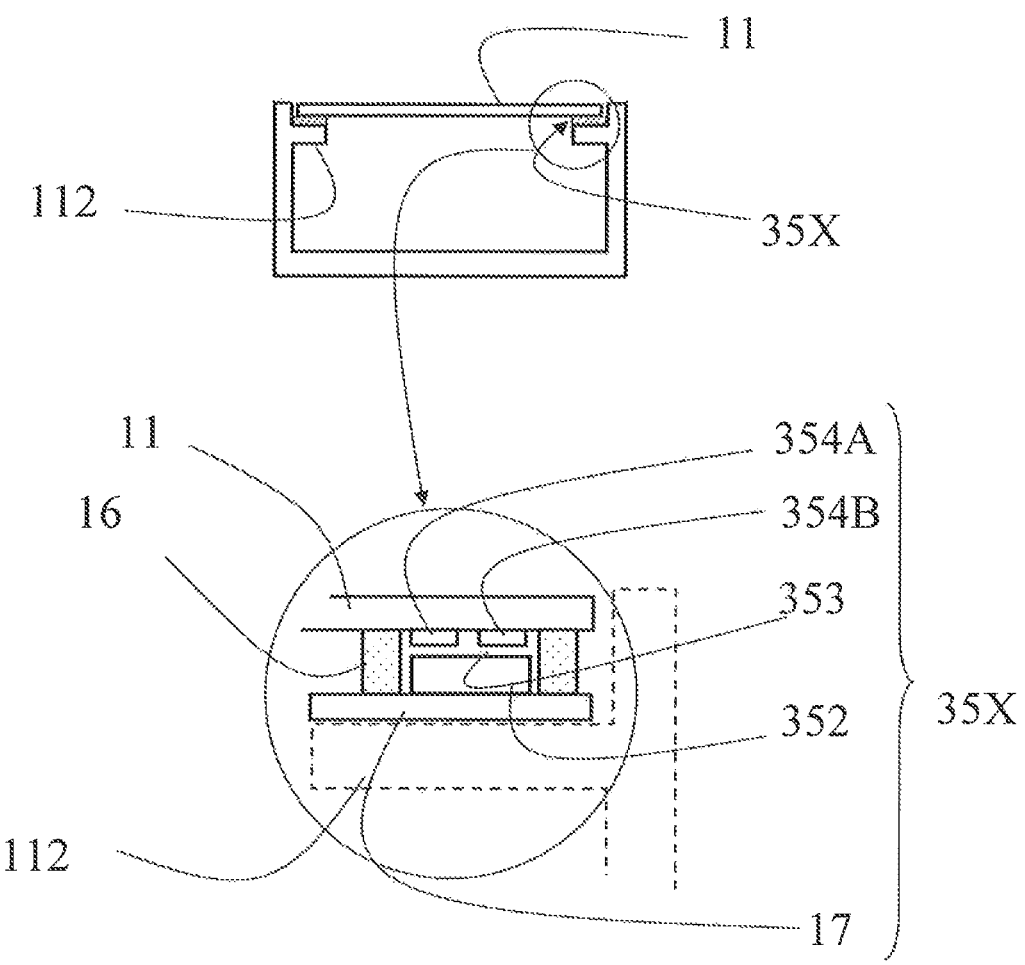
FIG. 7A shows a fourth embodiment of the present invention
FIG. 7B shows an enlarged view of partial area of FIG. 7A

FIG. 7A shows a fourth embodiment of the present invention

A cover glass 11 is mounted on top of a cell phone 10. A microstructure 35X is configured in between the cover glass 11 and the flange 112. The microstructure 35X incorporating the cover glass 11 forms a CGPB according to the present invention.

FIG. 7B shows an enlarged view of partial area of FIG. 7A

The microstructure 35X is configured on bottom surface of the cover glass 11. The cover glass 11 is configured on top of the microstructure 35X. A first electrode 354A and a second electrode 354B are configured on bottom surface of the cover glass 11. A space 353 is reserved under the electrodes 354A, 354B. A piece of piezoresistive material 352 is configured under the space 353 and formed on a bottom substrate 17. A pair of depressible spacers 16, in the section view, is configured in between the cover glass 11 and the bottom substrate 17 for keeping the space 353 in between the electrodes 354A, 354B and the piezoresistive material 352.

Figure 8:
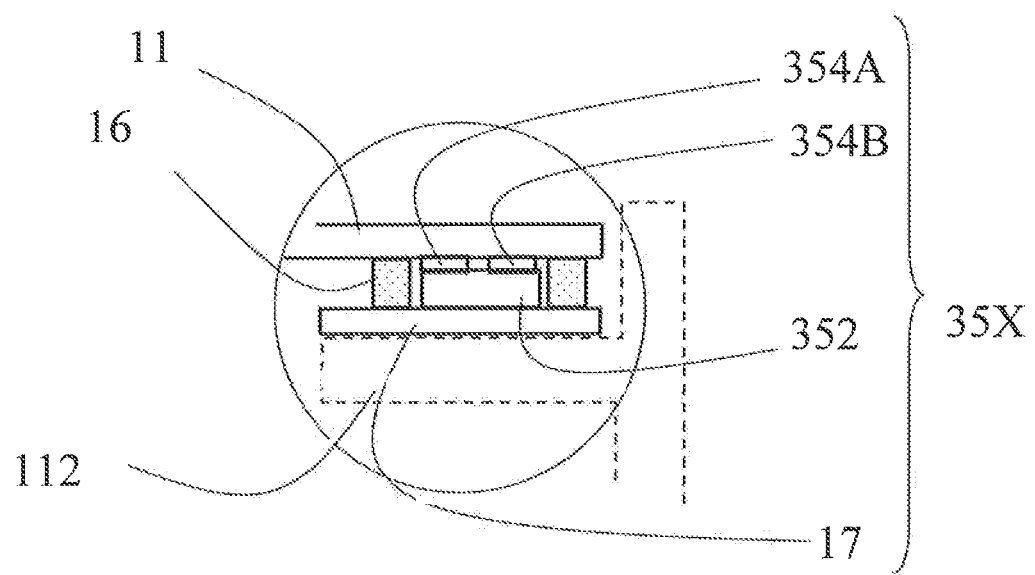
FIG. 8 shows the fourth embodiment being pressed.

FIG. 8 shows the fourth embodiment being pressed.

Before the cover glass 11 is pressed, the space 353 in between the electrodes 354A, 354B and the piezoresistive material 352 keeps the electrical path open between the first electrode 354A and the second electrode 354B. After the cover glass 11 is pressed, the space 353 disappears. When the electrodes 354A, 354B touch the piezoresistive material 352, the electrical path becomes closed between the first electrode 354A and the second electrode 354B through the piezoresistive material 352.

Figure 9:
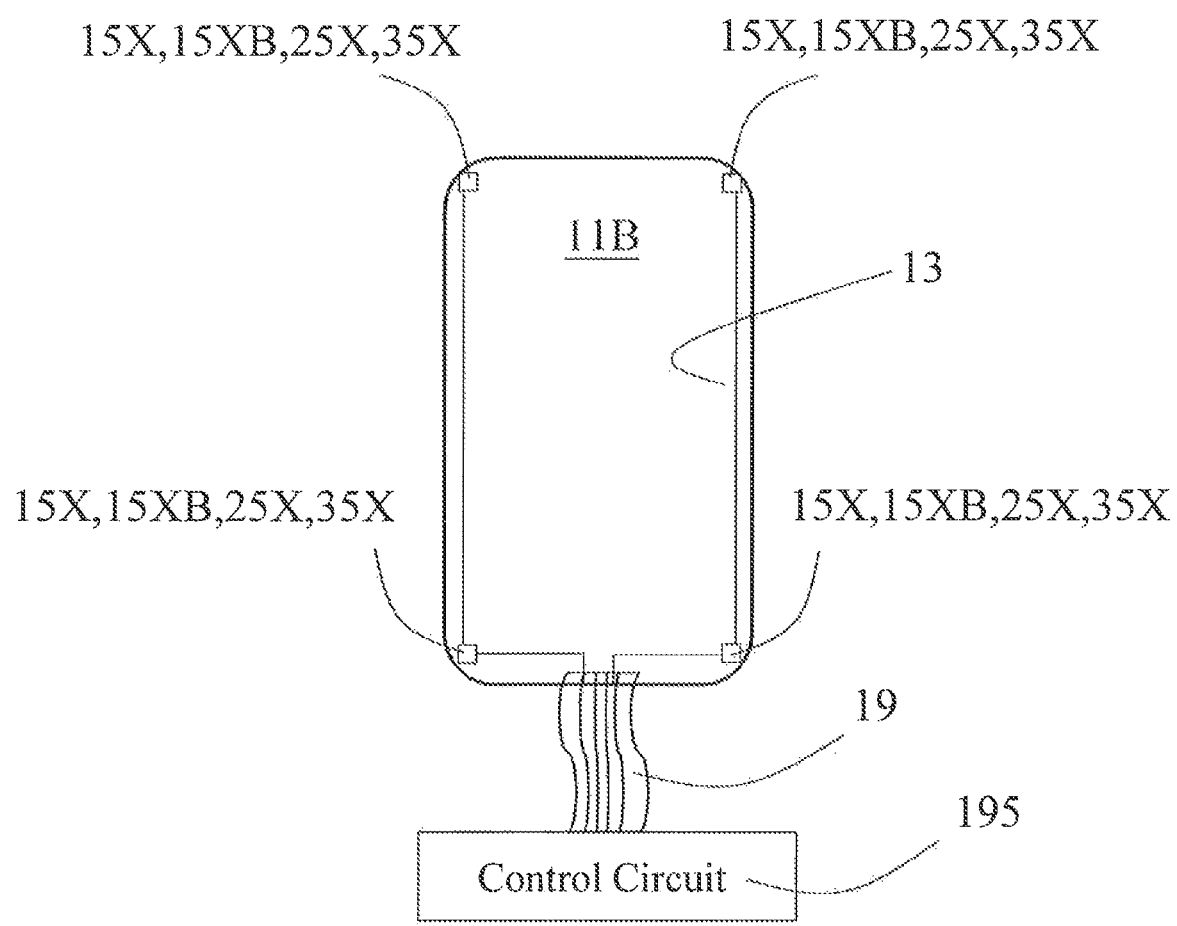
FIG. 9 shows a first application of the CGPB

FIG. 9 shows a first application of the CGPB

Four CGPBs of either 15X, 15XB, 25X, or 35X, are configured on a bottom surface 11B of the cover glass 11. A CGPB is configured on each of the four corners of the cover glass 11. Each of the CGPBs electrically couples to a piece of flexible circuit connector 19 through circuit 13. The flexible circuit connector 19 electrically couples to a control circuit 195. The control circuit 195 is configured to control functions of the image display module (not shown).

Figure 10:
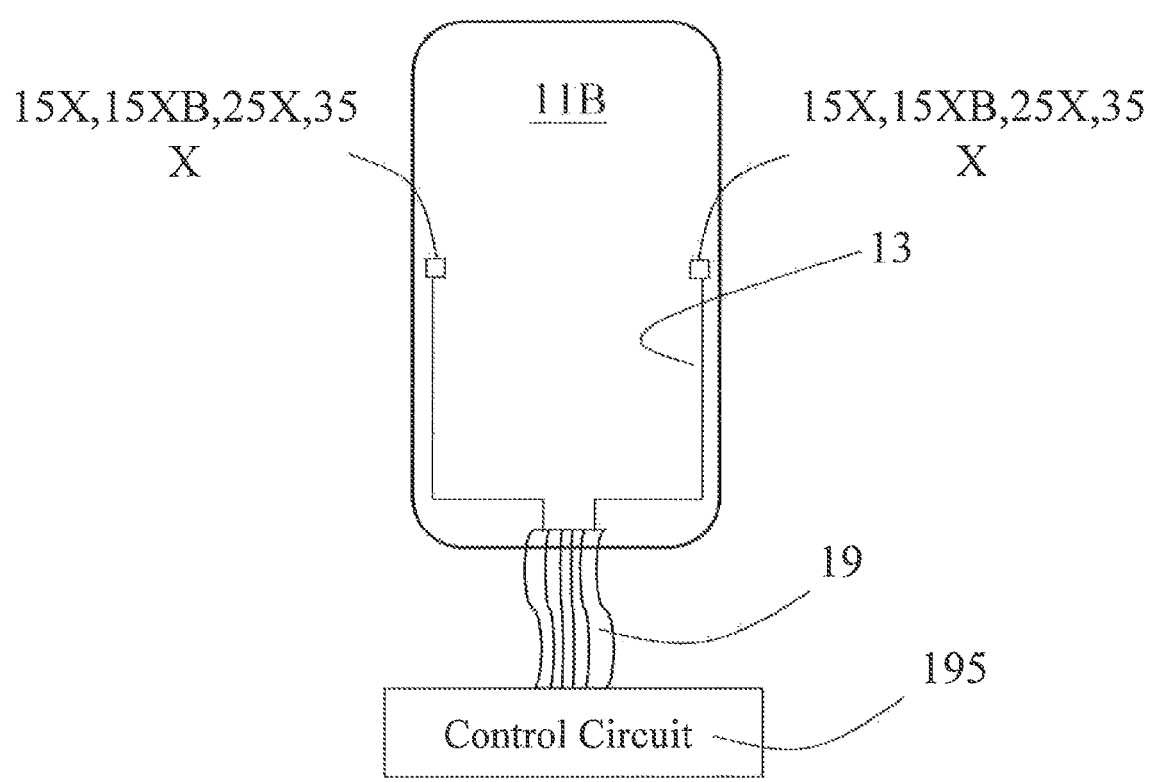
FIG. 10 shows a second application of the CGPB

FIG. 10 shows a second application of the CGPB

Two CGPBs of either 15X, 15XB, 25X, or 35X, are configured on a bottom surface of the cover glass 11. A CGPB is configured on each of the left and right sides. Each of the CGPBs electrically couples to a piece of flexible circuit connector 19 through circuit 13. The flexible circuit connector 19 electrically couples to a control circuit 195. The control circuit 195 is configured to control functions of the image display module (not shown).

Figure 11:
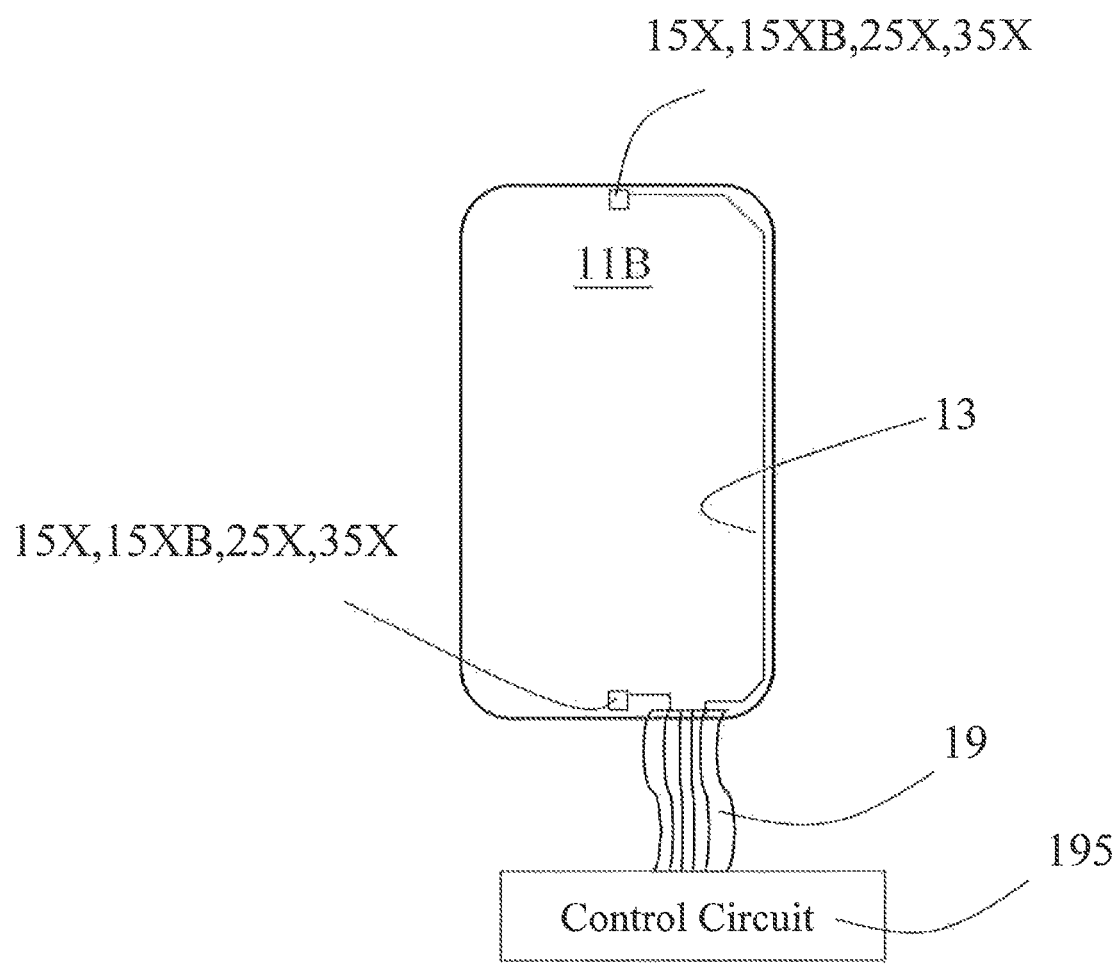
FIG. 11 shows a third application of the CGPB

FIG. 11 shows a third application of the CGPB

Two CGPBs of either 15X, 15XB, 25X, or 35X, are configured on a bottom surface of the cover glass 11. A CGPB is configured on each of the top and bottom sides. Each of the CGPBs having circuit 13 electrically couples to a piece of flexible circuit connector 19. The flexible circuit connector 19 electrically couples to a control circuit 195. The control circuit 195 is configured to control functions of the image display module (not shown).

Figure 12:
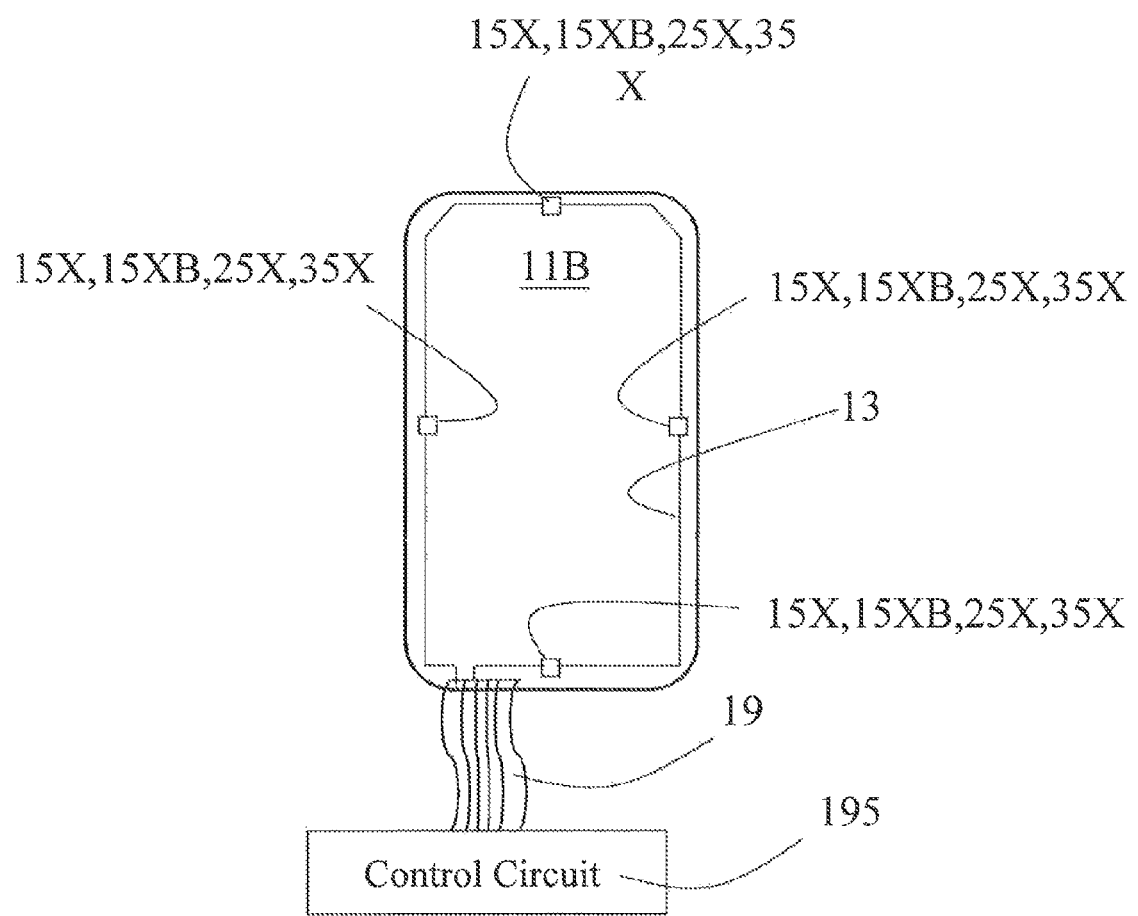
FIG. 12 shows a fourth application of the CGPB

FIG. 12 shows a fourth application of the CGPB

Four CGPB of either 15X, 15XB, 25X, or 35X, are configured on a bottom surface of the cover glass 11. A CGPB is configured on each of the four sides of the cover glass 11. Each of the CGPBs electrically couples to a piece of flexible circuit connector 19 through circuit 13. The flexible circuit connector 19 electrically couples to a control circuit 195. The control circuit 195 is configured to control functions of the image display module (not shown).

While several embodiments have been described by way of example, it will be apparent to those skilled in the art that various modifications may be configured without departing from the spirit of the present invention. Such modifications are all within the scope of the present invention, as defined by the appended claims.

What is claimed is:

1. A cover glass pressure button for an electronic device, the cover glass pressure button comprising:
   a cover glass; and
   at least one microstructure, comprising:
      at least one top electrode, configured on a bottom surface of said cover glass;
      at least one piece of pressure-sensitive material, configured on a bottom surface of said top electrode;
      a space, reserved under said pressure-sensitive material in a first state when the cover glass is not depressed;
      at least one bottom electrode, configured under said space; and
      a bottom substrate, configured on a bottom surface of said bottom electrode,
   wherein, in a second state when the cover glass is depressed, the pressure-sensitive material contacts the bottom electrode to create an electrical path from the top electrode to the bottom electrode via the pressure-sensitive material.

2. A cover glass pressure button for an electronic device as claimed in claim 1, further comprising:
   a depressible spacer, configured in between said cover glass and said bottom substrate for keeping said space in the first state before the cover glass being depressed, said spacer being compressible to bring the pressure-sensitive material into contact with the bottom electrode in the second state.

3. A cover glass pressure button for an electronic device as claimed in claim 1, further comprising:
   a flexible circuit connector; and
   a control circuit electrically coupled to said top and bottom electrodes via the flexible circuit connector.

4. A cover glass pressure button for an electronic device as claimed in claim 1, wherein the pressure-sensitive material includes piezoresistive material which is in direct contact with the electrodes in the second state.

5. A cover glass pressure button for an electronic device as claimed in claim 1, wherein
   said microstructure is located in a position selected from the group consisting of a corner, a left side, a right side, a top side, and a bottom side of the cover glass.

6. A cover glass pressure button for an electronic device as claimed in claim 1, wherein
   two said microstructures are each located in a position selected from the group consisting of a left side, a right side, a top side, a bottom side, a top-left corner, a top-right corner, a bottom-left corner, and a bottom-right corner of the cover glass.

7. A cover glass pressure button for an electronic device as claimed in claim 1, wherein
   four said microstructures are each configured on one of four corners of the cover glass.

8. A cover glass pressure button for an electronic device as claimed in claim 1, wherein
   four said microstructures are each configured on a middle of one side selected from the group consisting of a left side, a right side, a top side, and a bottom side of the cover glass.

9. A cover glass pressure button for an electronic device, the cover glass pressure button comprising:
   a cover glass; and
   at least one microstructure, comprising:
      at least one top electrode, configured on a bottom surface of said cover glass;
      a space, reserved under said top electrode in a first state when the cover glass is not depressed;

at least one piece of pressure-sensitive material, configured under said space;
at least one bottom electrode, configured on a bottom surface of said pressure-sensitive material; and
a bottom substrate, configured on a bottom surface of said bottom electrode,
wherein, in a second state when the cover glass is depressed, the top electrode contacts the pressure-sensitive material to create an electrical path from the top electrode to the bottom electrode via the pressure-sensitive material.

10. A cover glass pressure button for an electronic device as claimed in claim 9, further comprising:
a depressible spacer, configured in between said cover glass and said bottom substrate for keeping said space in the first state before the cover glass being depressed, said spacer being compressible to bring the pressure-sensitive material into contact with the top electrode in the second state.

11. A cover glass pressure button for an electronic device as claimed in claim 9, further comprising:
a flexible circuit connector; and
a control circuit electrically coupled to said top and bottom electrodes via the flexible circuit connector.

12. A cover glass pressure button for an electronic device as claimed in claim 9, wherein the pressure-sensitive material includes piezoresistive material which is in direct contact with the electrodes in the second state.

13. A cover glass pressure button for an electronic device as claimed in claim 9, wherein
said microstructure is located in a position selected from the group consisting of a corner, a top side, a bottom side, a left side, and a right side of the cover glass.

14. A cover glass pressure button for an electronic device as claimed in claim 9, wherein
two said microstructures are each located in a position selected from the group consisting of a left side, a right side, a top side, a bottom side, a top-left corner, a top-right corner, a bottom-left corner, and a bottom-right corner of the cover glass.

15. A cover glass pressure button for an electronic device as claimed in claim 9, wherein
four said microstructures are each configured on one of four corners of the cover glass.

16. A cover glass pressure button for an electronic device as claimed in claim 9, wherein
four said microstructures are each configured on one side selected from the group consisting of a left side, a right side, a top side, and a bottom side of the cover glass.

17. A cover glass pressure button for an electronic device, the cover glass pressure button comprising:
a cover glass; and
at least one microstructure, comprising:
at least one piece of pressure-sensitive material, configured on a bottom surface of said cover glass;
a space, reserved under said pressure-sensitive material;
at least one pair of electrodes, configured under said space in a first state when the cover glass is not depressed; and
a bottom substrate, configured on bottom surfaces of said electrodes,
wherein, in a second state when the cover glass is depressed, the pressure-sensitive material contacts and bridges the pair of electrodes to create an electrical path between the electrodes via the pressure-sensitive material.

18. A cover glass pressure button for an electronic device as claimed in claim 17, further comprising:
a depressible spacer, configured in between said cover glass and said bottom substrate for keeping said space in the first state before the cover glass being depressed, said spacer being compressible to bring the pressure-sensitive material into contact with the pair of electrodes in the second state.

19. A cover glass pressure button for an electronic device as claimed in claim 17, further comprising:
a flexible circuit connector; and
a control circuit electrically coupled to said pair of electrodes via the flexible circuit connector.

20. A cover glass pressure button for an electronic device as claimed in claim 17, wherein the pressure-sensitive material includes piezoresistive material which is in direct contact with the electrodes in the second state.

21. A cover glass pressure button for an electronic device as claimed in claim 17, wherein
said microstructure is located in a position selected from the group consisting of a corner, a left side, a right side, a top side, and a bottom side of the cover glass.

22. A cover glass pressure button for an electronic device as claimed in claim 17, wherein
two said microstructures are each located in a position selected from the group consisting of a left side, a right side, a top side, a bottom side, a top-left corner, a top-right corner, a bottom-left corner, and a bottom-right corner of the cover glass.

23. A cover glass pressure button for an electronic device as claimed in claim 17, wherein
four said microstructures are each configured on one of four corners of the cover glass.

24. A cover glass pressure button for an electronic device as claimed in claim 17, wherein
four said microstructures are each configured on one side selected from the group consisting of a left side, a right side, a top side, and a bottom side of the cover glass.

25. A cover glass pressure button for an electronic device, the cover glass pressure button comprising:
a cover glass; and
at least one microstructure, comprising:
at least one pair of electrodes, configured on a bottom surface of said cover glass;
a space, reserved under said electrodes in a first state when the cover glass is not depressed;
at least one piece of pressure-sensitive material, configured under said space; and
a bottom substrate, configured on a bottom surface of said pressure-sensitive material,
wherein, in a second state when the cover glass is depressed, the pressure-sensitive material contacts and bridges the pair of electrodes to create an electrical path between the electrodes via the pressure-sensitive material.

26. A cover glass pressure button for an electronic device as claimed in claim 25, further comprising:
a depressible spacer, configured in between said cover glass and said bottom substrate for keeping said space in the first state before the cover glass being depressed, said spacer being compressible to bring the pressure-sensitive material into contact with the pair of electrodes in the second state.

27. A cover glass pressure button for an electronic device as claimed in claim 25, further comprising:
a flexible circuit connector; and, a control circuit electrically coupled to the electrodes via the flexible circuit connector.

28. A cover glass pressure button for an electronic device as claimed in claim 25, wherein the pressure-sensitive material includes piezoresistive material which is in direct contact with the electrodes in the second state.

29. A cover glass pressure button for an electronic device as claimed in claim 25, wherein
said microstructure is located in a position selected from the group consisting of a corner, a left side, a right side, a top side, and a bottom side of the cover glass.

30. A cover glass pressure button for an electronic device as claimed in claim 25, wherein
two said microstructures are each located in a position selected from the group consisting of a left middle, a right middle, a top middle, a bottom middle, a top-left corner, a top-right corner, a bottom-left corner, and a bottom-right corner of the cover glass.

31. A cover glass pressure button for an electronic device as claimed in claim 25, wherein
four said microstructures are each configured on one of four corners of the cover glass.

32. A cover glass pressure button for an electronic device as claimed in claim 25, wherein
four said microstructures are each configured on one side selected from the group consisting of a left side, a right side, a top side, and a bottom side of the cover glass.

\* \* \* \* \*